(12) United States Patent
Furukawa (10) Patent No.: US 6,894,301 B2
(45) Date of Patent: May 17, 2005

(54) METHOD AND APPARATUS FOR TESTING CIRCUIT USING LIGHT EMISSION

(75) Inventor: Yasuo Furukawa, Tokyo (JP)

(73) Assignee: Advantest Corporation, Tokyo (JP)

(*) Notice: Subject to any disclaimer, the term of this patent is extended or adjusted under 35 U.S.C. 154(b) by 277 days.

(21) Appl. No.: 10/274,687

(22) Filed: Oct. 21, 2002

(65) Prior Publication Data

US 2003/0038646 A1 Feb. 27, 2003

Related U.S. Application Data

(63) Continuation of application No. PCT/JP01/03395, filed on Apr. 20, 2001.

(30) Foreign Application Priority Data

Apr. 21, 2000 (JP) ........................................ 2000-120710

(51) Int. Cl.[7] ............................................. G01N 61/86
(52) U.S. Cl. .............................. 250/559.4; 250/559.45; 356/237.4
(58) Field of Search ..................... 257/81, 85; 382/145, 382/147; 348/87

(56) References Cited

U.S. PATENT DOCUMENTS 5,981,967 A * 11/1999 Luo ........................ 250/559.4
6,650,768 B1 * 11/2003 Evans ........................ 382/145

FOREIGN PATENT DOCUMENTS

| EP | 0 937 989 A2 | * | 8/1999 |
| JP | 2-31175 | * | 2/1990 |
| JP | 11-16974 | * | 1/1999 |

OTHER PUBLICATIONS

International Preliminary Examination Report dated Jul. 18, 2002, 3 pages.

* cited by examiner

Primary Examiner—Tony Ko
Assistant Examiner—David Porta
(74) Attorney, Agent, or Firm—Osha & May L.L.P.

(57) ABSTRACT

A method and apparatus for testing a circuit by detecting light emission from the circuit. The circuit tester of the present invention includes a signal source, a photodetector, and a judging unit. The signal source supplies an input signal, which is a test pattern, to a circuit. The photodetector detects emission of hot electrons produced by the input signal supplied to the circuit, and converts it into an electrical signal. The judging unit judges the existence of a defect of the circuit based on a pulse width of the converted electrical signal. Specifically, a pulse width measurement element measures whether the pulse width of the electrical signal exceeds a predetermined pulse width, and a detector detects the existence of a defect of the circuit based on an output of the pulse width measurement element. When the pulse width of the electrical signal is long owing to abnormal current produced in the circuit, the detector judges that the circuit is defective.

11 Claims, 7 Drawing Sheets

METHOD AND APPARATUS FOR TESTING CIRCUIT USING LIGHT EMISSION

The present application is a continuation application of PCT/JP01/03395 filed on Apr. 20, 2001, claiming priority from a Japanese patent application No. 2000-120710 filed on Apr. 21, 2000, the contents of which are incorporated herein by reference.

BACKGROUND OF THE INVENTION

1. Field of the Invention

The present invention relates to a method and apparatus for testing circuit.

2. Description of the Related Art

Nowadays, enormous amounts of semiconductor devices are manufactured. The manufactured semiconductor device needs to be tested regarding the existence of a defect by the circuit tester, before shipping to the market. The circuit tester performs a test called a function test to a semiconductor device, and judges the quality thereof. In the function test, a test pattern is supplied to the semiconductor device and the quality is judged based on an output result from the semiconductor device.

In recent years, research for high integration of the semiconductor devices is advanced actively. With high integration of the semiconductor device, the test pattern for the function test has become more complicated and production of the test pattern has become more difficult. In addition, if all elements are to be tested perfectly by the function test about all possibilities of defects, since the amount of test patterns are enormous, it takes time for testing too much and such a function test is almost impossible.

There is a method called quiescent supply current test which measures quiescent supply current of the semiconductor device as a test method for efficient testing which has developed apart from the function test. This method is characterized by judging the quality of the semiconductor device by detecting abnormal current in a quiescent state, using the principle in which a normal transistor hardly allows current to pass in a quiescent state. However, since a design rule becomes fine and especially becomes in the order of 0.1 micrometer or less, leakage current increases and current difference between a normal device and a defective device becomes small. Therefore, it is considered that it is difficult to test the circuit which has such a fine pattern using the conventional quiescent supply current test method.

Moreover, in the conventional quiescent supply current test, in order to observe a current waveform, it is necessary to lower a test clock rate from a clock rate at the time of real operation. For example, when a semiconductor device is tested with clock rate at the time of real operation of several hundreds megahertz, it is difficult to observe a current waveform sufficiently accurately unless the test clock rate is lowered between several kilohertz and several tens kilohertz in the quiescent supply current test. Therefore, there has been a problem that the conventional quiescent supply current test requires long time.

SUMMARY OF THE INVENTION

Accordingly, it is an object of the present invention to provide a method and apparatus for testing circuit which solve the foregoing problem. The object can be achieved by combinations described in the independent claims. The dependent claims define further advantageous and exemplary combinations of the present invention.

In order to solve the foregoing problem, according to the first aspect of the present invention, there is provided a circuit test apparatus for testing a circuit. The circuit test apparatus includes a signal source which supplies an input signal to the circuit, a photodetector which detects emission of hot electrons produced by the input signal supplied to the circuit and converts the emission into an electrical signal, and a judging unit which judges existence of a defect of the circuit based on pulse width of the converted electrical signal.

It is preferable that the judging unit includes a pulse width measurement element which measures whether pulse width of the electrical signal exceeds predetermined pulse width. It is also preferable that the judging unit includes a detector which detects the existence of a defect of the circuit based on an output of the pulse width measurement element.

It is preferable that the circuit test apparatus further includes a test controller which controls the signal source based on existence of a defect of the circuit detected by the detector. In this case, it is preferable that the test controller instructs the signal source to restrict supply of the input signal to the circuit based on existence of a defect of the circuit detected by the detector.

It is preferable that the signal source supplies the input signal to the circuit at a substantially same rate with a rate in a real operating state of the circuit. It is preferable that the photodetector blocks emission of hot electrons produced in a predetermined element in the circuit.

According to the second aspect of the present invention, there is provided a circuit test method for testing a circuit. The circuit test method includes steps of supplying an input signal to the circuit, detecting emission of hot electrons produced by the input signal supplied to the circuit, converting the emission into an electrical signal, and judging existence of a defect of the circuit based on pulse width of the converted electrical signal.

Furthermore, according to the third aspect of the present invention, there is provided a circuit test method for testing a circuit. The circuit test method includes steps of supplying an input signal to the circuit, observing a supply current waveform of the circuit to which the input signal is supplied, and judging existence of a defect of the circuit based on pulse width of the supply current waveform.

The observing step may observe a supply current waveform of a predetermined element in the circuit. It is also preferable that the observing step includes a step of detecting emission of hot electrons produced by current passing in the element, and converting the emission into an electrical signal.

This summary of invention does not necessarily describe all necessary features so that the invention may also be a sub-combination of these described features.

DETAILED DESCRIPTION OF THE INVENTION

The invention will now be described based on the embodiments hereinafter, which do not intend to limit the scope of the present invention as defined in the appended claims. All of the features and the combinations thereof described in the embodiments are not necessarily essential to the invention.

Figure 1:
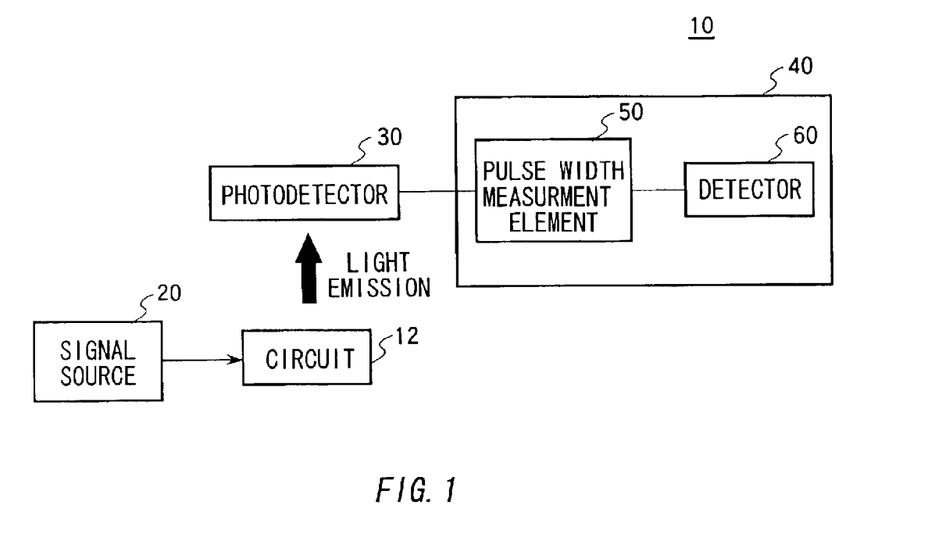
FIG. 1 is a block diagram of a circuit tester 10 in an embodiment of the present invention for testing a circuit 12.

FIG. 1 is a block diagram of a circuit tester 10 in an embodiment of the present invention for testing a circuit 12. The circuit 12 is a semiconductor chip formed by, for example, a CMOS circuit and the like. The circuit tester 10 in the present embodiment includes a signal source 20, a photodetector 30, and a judging unit 40.

The signal source 20 supplies an input signal, which is a test pattern, to the circuit 12. The signal source 20 supplies the input signal to the circuit 12 at a substantially same rate with a rate in a real operating state of the circuit 12. As is mentioned later, the circuit tester 10 judges the quality of the circuit 12 by detecting light emission. By using light emission, the circuit tester 10 in the present embodiment can test a circuit at a real rate, and solve the problem of a conventional quiescent supply current test which requires long testing time since an input signal has to be supplied at a low testing rate.

Carriers in a semiconductor (hot electrons) are accelerated in CMOS circuit area in the circuit 12 by an impressed electric field and obtained energy. For example, in an field effect transistor (FET), the electric field impressed between a source and a drain is very high as about 106 V/cm. In such high electric field, the carriers obtain sufficient energy to generate quantity of light which can be measured in a visible region and an infrared region of a spectrum. The carriers having high energy is emitted when the FET changes a state.

In this way, when the input signal is supplied to the circuit 12, light is generated at a portion where current is passing. The photodetector 30 detects the emission of the hot electrons generated by the input signal to the circuit 12, and converts it into an electrical signal. The judging unit 40 judges existence of a defect of the circuit 12 based on pulse width of the converted electrical signal.

The judging unit 40 has a pulse width measurement element 50 and a detector 60. The pulse width measurement element 50 measures pulse width of the electrical signal supplied from the photodetector 30. In the present embodiment, the pulse width measurement element 50 measures whether the pulse width of the electrical signal exceeds predetermined pulse width, and outputs the measurement result. The detector 60 detects existence of a defect of the circuit 12 based on the measurement result outputted from the pulse width measurement element 50.

Figure 2A:
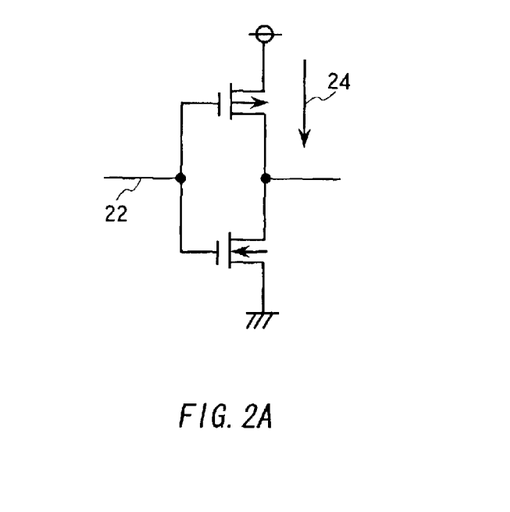
FIGS. 2A and 2B are explanatory diagrams for explaining a principle of a circuit test method by the present invention.
Figure 2B:
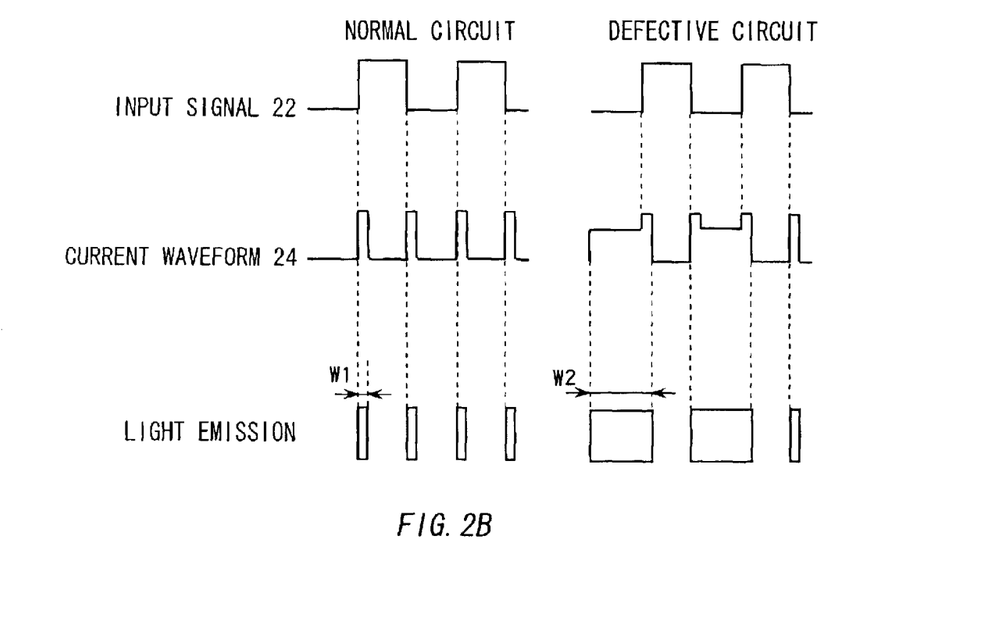

FIGS. 2A and 2B are explanatory diagrams for explaining a principle of a circuit test method by the present invention. Specifically, FIG. 2A shows an inverter circuit which consists of a p-channel transistor and an n-channel transistor. It is explained how to judge the existence of a defect of the circuit by the circuit tester 10 shown in FIG. 1 by observing a waveform of a supply current 24 which passes through the p-channel transistor, when the p-channel transistor of this inverter circuit is defective, for example.

FIG. 2B shows relation between a supply current waveform and light emission produced by the passing current in a case where the circuit is normal, and in a case where the circuit is defective. In a case where the circuit is normal, when an input signal 22 inputs into the inverter circuit, a transient current passes through the element and light is emitted at the moment when the state of each transistor is changed. The photodetector 30 converts the light emission produced by the transient current into the electrical signal having a pulse width w1.

In a case where there is a defective element in the circuit, abnormal current passes through the element between the pulses of the transient current. At this time, the photodetector 30 detects not only the transient current but also the light emission by the abnormal current. In FIG. 2B, an example is shown where the p-channel transistor of the inverter circuit is short-circuited, and the photodetector 30 detects light emission from the defective p-channel transistor and converts it into the electrical signal. At this time, the photodetector 30 outputs a pulse having a pulse width w2, which is wider than the pulse width w1 by the transient current.

The circuit tester 10 in the present embodiment may observe the current waveform 24 itself, and may judge existence of a defect of the circuit based on the pulse width of the current waveform 24. At this time, it is preferable that the circuit tester 10 includes a pulse width measurement element which measures the pulse width of the current waveform 24. Unlike the waveform shown in FIG. 2B, the actual current waveform 24 is curved owing to capacity in the circuit. Therefore, the pulse width measurement element has to be capable of measuring the pulse width of the current waveform accurately.

The photodetector 30 shown in FIG. 1, which is an embodiment of the present invention, converts the light emission produced in the circuit into the electrical signal with steep rise edge and fall edge, without being influenced by the capacity in the circuit. Therefore, the pulse width measurement element 50 can measure the pulse width of the electrical signal easily.

Figure 3:
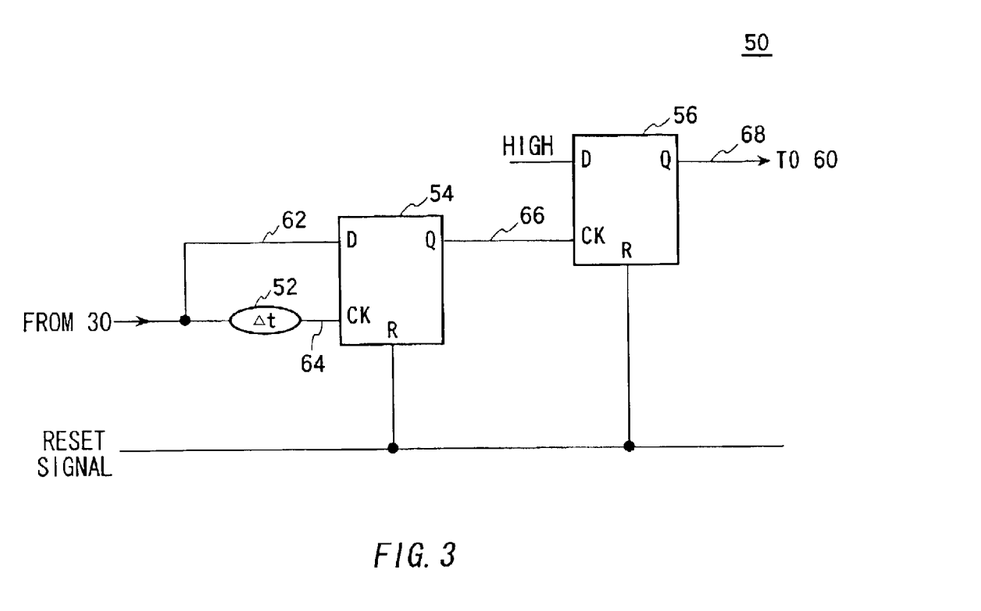
FIG. 3 is a connection diagram of a pulse width measurement element 50 in an embodiment.

FIG. 3 is a connection diagram of the pulse width measurement element 50 in one embodiment of the present invention. In the present embodiment, the pulse width measurement element 50 includes flip-flops 54 and 56. An electrical signal outputted from the photodetector 30 inputs to a D input of the flip-flop 54, and an electrical signal, which is delayed for Δt from the electrical signal from the photodetector 30, inputs to a CK input. A Q output of the flip-flop 54 connects to a CK input of the flip-flop 56. A high signal (logical value of 1) inputs into a D input of the flip-flop 56.

Figure 4:
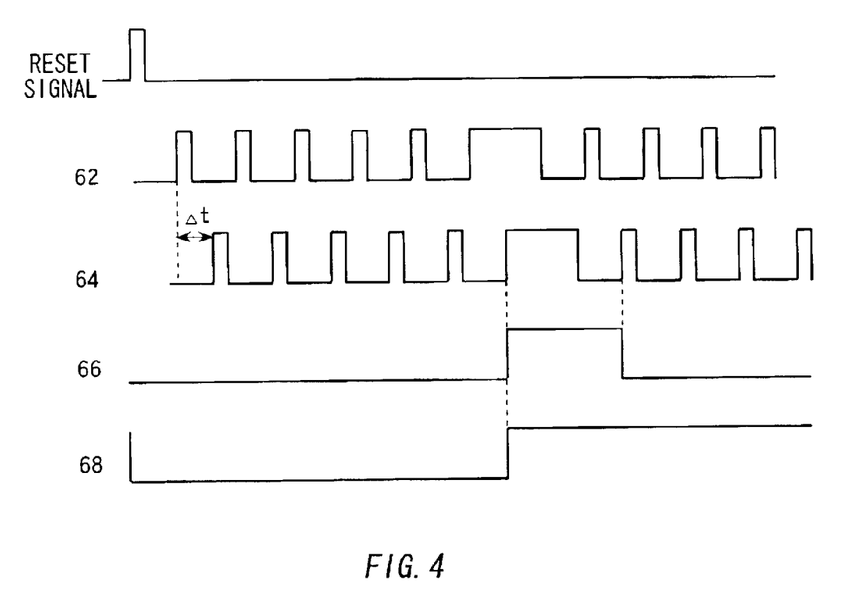
FIG. 4 shows signal timings of the pulse width measurement element 50 shown in FIG. 3.

FIG. 4 shows signal timings in the pulse width measurement element 50 shown in FIG. 3. With reference to FIG. 3, a reset signal inputs into R inputs of the flip-flops 54 and 56 before starting measurement of the pulse width. Then an electrical signal 62 outputted from the photodetector 30 inputs into the D input of the flip-flop 54. The electrical signal, which is delayed for Δt, inputs into the CK input. It is preferable that the delay amount Δt is set shorter than cycle of a pulse waveform by the transient current which appears in the electrical signal.

In the electrical signal 62, in a case where there is a pulse width longer than Δt, the Q output of the flip-flop 54 goes to a high logic level. The flip-flop 56 outputs high logic level signal, which is supplied to the D input, as an output 68 from the Q output, when the CK input receives the high logic level signal. In this way, the pulse width measurement element 50 detects the pulse which is wider than a predetermined pulse width, and outputs the detection result as the output 68 to the detector 60. The detector 60 receives the output 68 and judges that the tested circuit is defective by detecting the high logic level of the output 68.

In the example shown in FIGS. 3 and 4, the pulse width measurement element 50 detects the pulse wider than the predetermined pulse width. In another embodiment, the pulse width measurement element 50 may be a time interval measurement device which measures the pulse width using a counter. In this case, the detector 60 compares a length of time of the pulse width measured by the pulse width measurement element 50 with a predetermined length of time for reference, and the circuit 12 is judged that it is defective in a case where the measured length of time is longer than the predetermined length of time for reference.

Figure 5A:
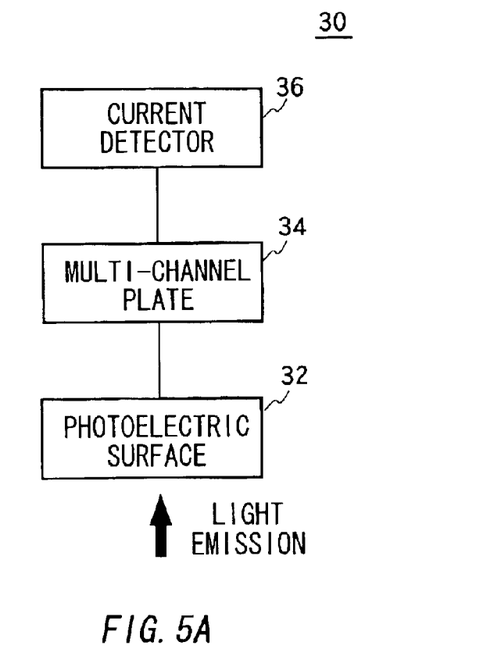
FIGS. 5A and 5B show an example of configuration of a photodetector 30.
Figure 5B:
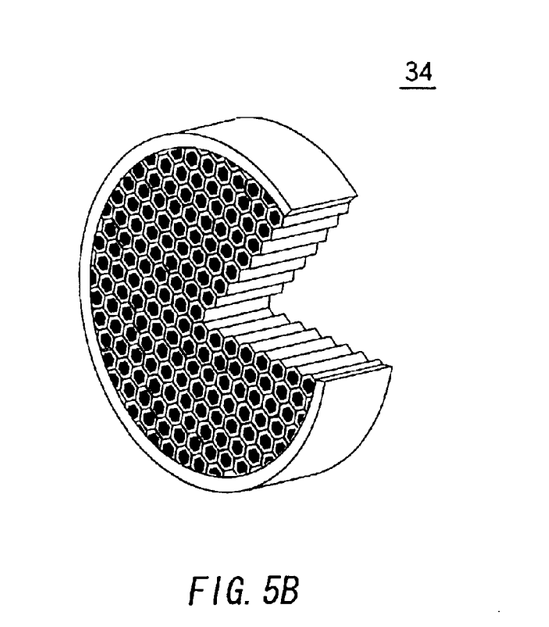

FIGS. 5A and 5B show an example of configuration of the photodetector 30. FIG. 5A is a functional block diagram of the photodetector 30. The photodetector 30 includes a photoelectric surface 32, a multi-channel plate 34, and a current detector 36. The multi-channel plate 34 is a photomultiplication device which multiplies electrons emitted from the photoelectric surface 32.

FIG. 5B is a sectional view of the multi-channel plates 34 partly broken away. As it is shown in FIG. 5B, the multi-channel plate 34 includes a plurality of channels which multiply the electrons obtained on the photoelectric surface 32.

In a case where the circuit 12 to be tested consists of only a CMOS circuit, the circuit test method of the present invention judges a defect of the circuit 12 by observing abnormal current which exists between transient currents. Besides the CMOS circuit, the circuit 12 may have an element, like a diode or an analog device, which emits light regularly during a period when the signal is being inputted. Current may pass through the analog device and the analog device may emit light, even during a period between the light emissions by the transient current in the CMOS circuit. In order to realize this test method, it is preferable that the photodetector 30 has a function to block the emission of the hot electrons produced in a predetermined element in the circuit 12 so as not to detect the emission.

The multi-channel plate 34 shown in FIG. 5B may close the channel electrically, by not impressing acceleration voltage in a channel corresponding to the position where the element is located in the circuit 12, for example, in order to realize the function for not detecting light emission from a predetermined element. In a case where position resolution of the optical detector 30 itself is insufficient, a lens maybe provided between the optical detector 30 and the circuit 12 to be tested so that area on the circuit 12 is magnified and the optical detector 30 has sufficient position resolution. In this case, it is preferable that the photodetector 30 is capable of detecting light emission from a CMOS circuit or the like by masking light emission from a predetermined element such as an analog element.

Figure 6:
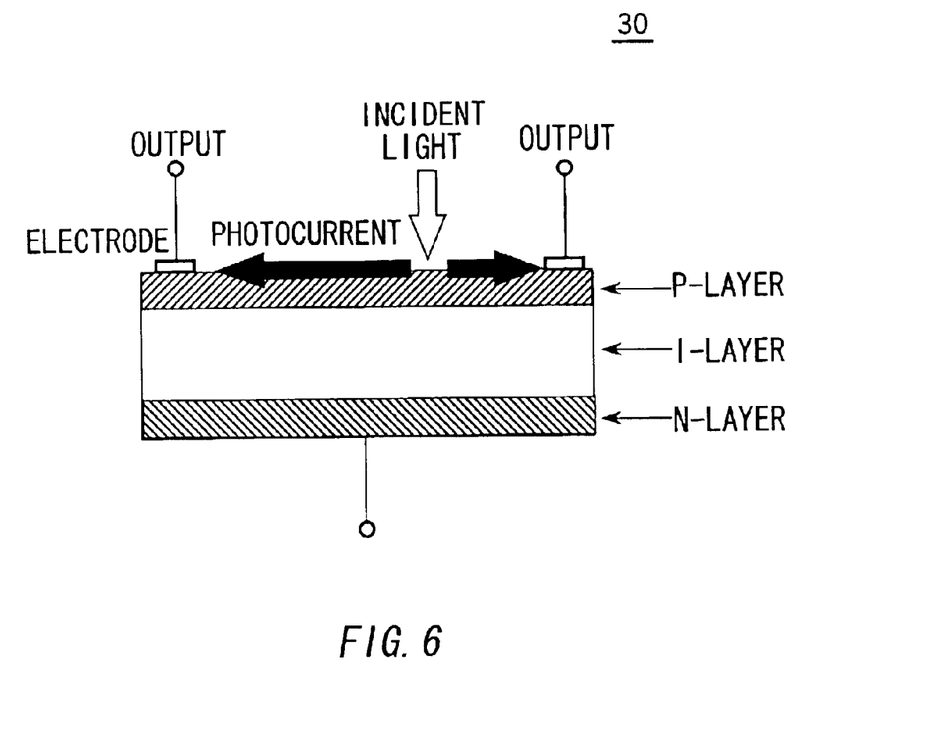
FIG. 6 shows an embodiment of the photodetector 30 including a function to detect a position of light emission from the circuit 12 in two dimension.

FIG. 6 shows an embodiment of the photodetector 30 including a function to detect a position of light emission from the circuit 12 in two dimension. The photodetector 30 in the present embodiment is capable of detecting the position of the light emission from the circuit 12 using current ratio of photocurrent produced by incident light from the circuit 12. In the present embodiment depicted in FIG. 6, the photodetector 30 is capable of detecting the position of the light emission from the circuit 12 in single dimension based on the current ratio outputted from electrodes provided on both side of a surface. In order to detect the position of the light emission in two dimensions, it is preferable that the photodetector 30 includes electrodes distributed in a plurality of positions on the surface. If it is judged that the light is emitted by an analog element or the like after pinpointing the position of the light emission, it is preferable that the photodetector 30 disregards the light emission from the position, detects only the light emission from a defective element, and converts it into an electrical signal.

Figure 7:
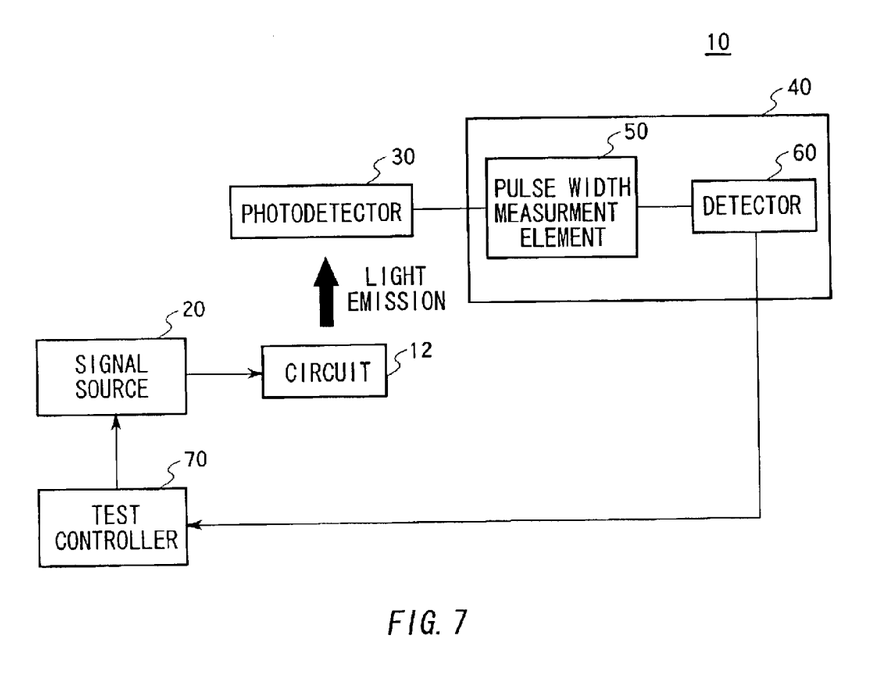
FIG. 7 is a block diagram of the circuit tester 10 in another embodiment.

FIG. 7 is a block diagram of the circuit tester 10 in another embodiment. In FIG. 7, a component which bears the same reference numeral as FIG. 1 is the same as, or has the same function as, the component in FIG. 1. The circuit tester 10 in the present embodiment includes a test controller 70 which controls the signal source 20.

The test controller 70 controls the signal source 20 based on existence of a defect of the circuit 12 detected by the detector 60. Specifically, in a case where the detector 60 judges the circuit 12 to be defective based on the emission of the hot electrons produced in the circuit 12 by supplying a predetermined test pattern to the circuit 12, the detector 60 notifies the test controller 70 that the defect is detected. The test controller 70 instructs the signal source 20 to restrict supply of the test pattern to the circuit 12 based on the notice from the detector 60. For example, in a case where the circuit 12 is judged to be defective, the test controller 70 instructs the signal source 20 to stop the supply of the test pattern to the circuit 12.

In a case where the detector 60 judges the circuit 12 to be normal based on the emission of the hot electrons produced in the circuit 12 by supplying a predetermined test pattern to the circuit 12, the detector 60 notifies the test controller 70 that the defect is not detected. In this case, it is preferable that the test controller 70 instructs the signal source 20 to supply another test pattern, which is to be supplied following the predetermined test pattern, to the signal source 20.

The test controller 70 allows the circuit tester 10 in the present embodiment to automate the test when the circuit tester 10 tests the circuit 12, by supplying the plurality of test patterns, each of which is different from each other, to the circuit 12. That is, in a case where a circuit is tested by supplying the plurality of test patterns, each of which is different from each other, to the predetermined circuit, duration of the test can be shortened significantly, because when a defect of a circuit is detected in a predetermined test pattern, the test of the circuit is stopped and a next circuit is tested automatically.

As it is obvious from the foregoing explanation, according to the present invention, there are provided the method and the apparatus for testing circuit using light emission produced by a defective element. Although the present invention has been described by way of exemplary embodiment, the scope of the present invention is not limited to the foregoing embodiment. Various modifications in the foregoing embodiment may be made when the present invention defined in the appended claims is enforced. It is obvious from the definition of the appended claims that embodiments with such modifications also belong to the scope of the present invention.

What is claimed is:

1. A circuit test apparatus for testing a circuit, comprising:
   a signal source which supplies an input signal to the circuit;
   a photodetector which detects emission of hot electrons produced by the input signal supplied to the circuit and emitted from the circuit, and converts the emission into an electrical signal; and
   a judging unit which judges existence of a defect in the circuit based on a pulse width of the converted electrical signal, said judging unit comprising:

a pulse width measurement element which inputs a timing signal delayed by a predetermined pulse width from a timing of the converted electrical signal and measures whether the pulse width of the converted electrical signal exceeds the predetermined pulse width.

2. The circuit test apparatus as claimed in claim 1, wherein said judging unit includes a detector which detects the existence of a defect of the circuit based on an output of said pulse width measurement element.

3. The circuit test apparatus as claimed in claim 2, further comprising a test controller which controls said signal source based on existence of a defect of the circuit detected by said detector.

4. The circuit test apparatus as claimed in claim 1, wherein said signal source supplies the input signal to the circuit at a substantially same rate as a rate in a real operating state of the circuit.

5. The circuit test apparatus as claimed in claim 1, wherein said photodetector blocks emission of hot electrons produced in a predetermined element in the circuit.

6. A circuit test method for testing a circuit, comprising steps of:
supplying an input signal to the circuit;
detecting emission of hot electrons which is produced by the input signal supplied to the circuit and is emitted from the circuit;
converting the emission into an electrical signal; and
judging existence of a defect of the circuit based on a pulse width of the converted electrical signal, the judging comprising:
inputting a timing signal delayed by a predetermined pulse width from a timing of the converted electrical signal and measuring whether the pulse width of the converted electrical signal exceeds the predetermined pulse width.

7. The circuit test apparatus as claimed in claim 1, wherein said judging unit judges the existence of the defect when the pulse width of the converted electrical signal is longer than the predetermined pulse width.

8. The method of claim 6, further comprising detecting the existence of a defect of the circuit based on said pulse width measurement.

9. The method of claim 6, further comprising controlling said signal source based on existence of a detected defect of the circuit.

10. The method of claim 6, further comprising supplying the input signal to the circuit at a substantially same rate as a rate in a real operating state of the circuit.

11. The method of claim 6, further comprising blocking emission of hot electrons produced in a predetermined element in the circuit.

* * * * *